United States Patent
Rickes et al.

(10) Patent No.: US 6,804,141 B1
(45) Date of Patent: Oct. 12, 2004

(54) DYNAMIC REFERENCE VOLTAGE CALIBRATION INTEGRATED FERAMS

(75) Inventors: Juergen T. Rickes, Cupertino, CA (US); Yacoub Mustafa, Aachen (DE); Hugh P. McAdams, McKinney, TX (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 6 days.

(21) Appl. No.: 10/442,360

(22) Filed: May 20, 2003

(51) Int. Cl.[7] ................................................ G11C 11/12
(52) U.S. Cl. .................................... 365/145; 365/189.11
(58) Field of Search ............................ 365/145, 189.11, 365/210, 189.07

(56) References Cited

U.S. PATENT DOCUMENTS 6,392,916 B1 * 5/2002 Choi et al. ................... 365/145
6,704,218 B2 * 3/2004 Rickes et al. ................ 365/145
6,754,094 B2 * 6/2004 McClure ...................... 365/145

* cited by examiner

Primary Examiner—Tan T. Nguyen

(57) ABSTRACT

A FeRAM includes a reference voltage calibration circuit that evaluates FeRAM cells and selects reference voltages for reading the FeRAM cells. Calibration of the reference voltage can be performed dynamically during normal operation of the FeRAM so that the reference voltage tracks changes in FeRAM cell performance that may be associated with temperature or aging effects. Dynamic calibration during normal use eliminates the need for a reference voltage calibration process during manufacture of the memory. The calibration circuit can further be connected to redundancy circuitry that replaces FeRAM cells that the calibration circuit determines are weak.

14 Claims, 12 Drawing Sheets

DYNAMIC REFERENCE VOLTAGE CALIBRATION INTEGRATED FERAMS

BACKGROUND

Conventional ferroelectric random access memories (FeRAMs) have memory cells containing ferroelectric capacitors. Each ferroelectric capacitor contains a ferroelectric material sandwiched between conductive plates, and the polarization state of the ferroelectric material indicates a stored data value. To write a data bit in a memory cell, a write operation applies write voltages to the plates of the ferroelectric capacitor to polarize the ferroelectric material in a direction associated with the data bit being written. A persistent polarization remains in the ferroelectric material after the write voltages are removed, which in turn maintains a charge on the conductive plates.

A conventional read operation for a FeRAM cell connects one plate of a ferroelectric capacitor to a bit line and raises the other plate to a read voltage. If the persistent polarization in the ferroelectric capacitor is in a direction corresponding to the read voltage, the read voltage causes a relatively small current through the ferroelectric capacitor, resulting in a small voltage change on the bit line. If the persistent polarization initially opposes the read voltage, the read voltage flips the direction of the persistent polarization, discharging the plates and resulting in a relatively large current and voltage increase on the bit line. A sense amplifier can sense the resulting bit line current or voltage to determine the stored value.

FIG. 1 illustrates a portion of a conventional FeRAM 100 that includes memory cells 110 arranged in rows and columns to form a memory array. Only one column and two rows of memory cells 110 are shown in FIG. 1 for simplicity of illustration, but a typical FeRAM array may include hundreds or thousands of columns of memory cells with a similar number of rows. Each memory cell 110 of FeRAM 100 includes a ferroelectric capacitor 112 and a select transistor 114. Each select transistor 114 has a gate connected to a word line 116 corresponding to the row containing the memory cell and a source/drain connected to a bit line 118 corresponding to the column containing the memory cell.

A conventional read operation accessing a selected memory cell 110 in FeRAM 100 biases a plate of the selected memory cell 110 to a plate voltage Vp (e.g., about 3 V), and activates a selected word line 116 to turn on a select transistor 114 thereby electrically connecting the selected ferroelectric capacitor 112 to bit line 118. The difference between the plate voltage and the initial bit line voltage forces the persistent polarization in the selected ferroelectric capacitor into a first state. Bit line 118 acquires a voltage V0 or V1 that depends on the initial polarization state of the selected memory cell 110. In particular, if the selected memory cell 110 was in a second state having a persistent polarization in a direction opposite to the persistent polarization of the first state, forcing the memory cell from the second state into the first state causes a relatively large current to bit line 118 and a corresponding bit line voltage V1. If the selected memory cell was already in the first state, a relatively small current flows to bit line 118, and the bit line acquires a lower voltage V0.

A sense amplifier 130 connected to the bit line 118 compares the bit line voltage V0 or V1 to a reference voltage VREF. A reference voltage generator 140 generates reference voltage VREF, which is preferably about halfway between voltages V0 and V1. In sense amplifier 130, cross-coupled transistors drive bit line 118 to a logic level (high or low) depending on whether the bit line voltage V0 or V1 was greater or less than reference voltage VREF. The bit read has a value indicated by the voltage on bit line 118 after operation of sense amplifier 130.

The generation of reference voltage VREF for comparison to the developed bit line voltage V0 or V1 is critical to data integrity. However, the variable properties of ferroelectric capacitors 118, which are process and time dependent, can make selection of a voltage level for reference voltage VREF difficult. More specifically, ferroelectric capacitors 112 generally differ somewhat from each other due to manufacturing variations and locations across the memory array. As a result, different memory cells 110 generate different voltages when accessed.

FIG. 2 illustrates a distribution of bit line voltage resulting from reading the ferroelectric capacitors in a FeRAM. As illustrated, a histogram 200 of bit line voltages generated when reading FeRAM cells in a first state is bell-shaped and centered at voltage $V0_{AVE}$. A histogram 210 of bit line voltages generated when reading memory cells in a second state is bell-shaped and centered at voltage $V1_{AVE}$. Ideally, the reference voltage generator generates a reference voltage VREF that accommodates weak cells, (e.g., cells for which voltage V1 is relatively low or voltage V0 is relatively high) so that the weak cells still function, thus giving the highest yield of functional FeRAM circuits.

Factors such as ageing, temperature, and imprint of the FeRAM cells may further shift or change the voltage distributions illustrated in FIG. 2. The cells that are more frequently accessed degrade or "fatigue" faster than the less frequently accessed cells. The ferroelectric capacitors are also subject to "relaxation" and "imprint." Relaxation refers to partial loss of remnant charge in a microsecond regime if the ferroelectric capacitor is left unaccessed following a sequence of continuous read/write cycling. Imprint, which appears as a voltage offset in both voltages V1 and V0, refers to the tendency of a ferroelectric capacitor to prefer one state over the other if the FeRAM cell remains in that state for a long period of time. Selecting a reference voltage VREF that can provide the required data integrity over a long useful life of the memory can be difficult.

SUMMARY

In accordance with an aspect of the invention, a reference voltage generator for a FeRAM periodically (e.g., at start up and/or every few minutes during operation) calibrates the reference voltage to track memory cell variation due to factors such as temperature and aging. As a result, the calibrated reference voltage provides high data integrity over an extended life of the FeRAM. Further, the self-calibrating reference voltage generator does not require an initial calibration during fabrication of the FeRAM. Thus, manufacturing or packaging processes such as metal masking or fuse cutting to set the optimal reference voltage for each die are not required.

In accordance with another aspect of the invention, calibration circuitry for the reference voltage can be combined with redundancy circuitry. The calibration circuitry can thus measure a charge distribution for reference voltage selection and during that process identify memory cells that do not provide adequate bit line voltages. The identified memory cells can then be replaced with redundant memory cells on the chip. Dynamic identification of memory cells that become defective can dramatically increase the useful life of the FeRAM.

One specific embodiment of the invention is a memory that includes an array of ferroelectric memory cells, sense amplifiers, a reference voltage generator, and a calibration circuit. The reference voltage generator uses an input value (e.g., a stored digital value) to control the voltage level of a reference signal that the reference voltage generator provides to the sense amplifiers for use when sensing bit lines. The calibration circuit controls a calibration operation that evaluates bit line voltages read out of a set of the ferroelectric memory cells and based on an evaluation result, sets the input value to be used when reading the set of ferroelectric memory cells.

The calibration circuit, in one embodiment, includes a first counter and control logic. The first counter holds a first count that is applied as the input value of the reference voltage generator during evaluation of bit line voltages read out when the ferroelectric memory cells store a first value (e.g., 0). During evaluation, the control logic causes the first counter to increment the first count until a data signal from the sense amplifiers represents the first value. Additionally, a second counter may be included in the calibration circuit to hold a second count that is applied as the input value of the reference voltage generator during evaluation of bit line voltages read out when the set of ferroelectric memory cells store a second value (e.g., 1), and the control logic causes the second counter to decrement the second count until the data signal from the sense amplifiers represents the second value.

The first and second counts can be used in calculating an input value to the reference voltage generator. For this purpose, the calibration circuit can further include a comparator coupled to the first and second counters. The control logic alternately causes the first counter to increment the first count and the second counter to decrement the second count until the comparator indicates the first and second counts are equal. The first and second counters then hold an average of the counts found from evaluating bit line voltages. The average is the input value used when reading the ferroelectric memory cells.

The memory can further include redundancy circuitry coupled to the calibration circuit. In addition to controlling the calibration operation, the calibration circuit signals the redundancy circuit when evaluating the bit line voltages identifies that one or more of the ferroelectric memory cells are weak. In response, the redundancy circuitry replaces the weak ferroelectric memory cells.

Another specific embodiment of the invention is a method for operating a memory. The method includes evaluating bit line voltages read out of a set of ferroelectric memory cells and storing a reference value that the evaluation of the bit line voltages indicates corresponds to a voltage level for a reference signal that permits accurate reading of the ferroelectric memory cells. A control circuit internal to the memory can control evaluating the bit line voltages and storing of the reference value to permit calibration of the reference voltage during normal use of the memory.

One technique for evaluating the bit line voltages includes: (a.) writing a data value in the set of ferroelectric memory cells; (b.) reading out bit line voltages from the ferroelectric memory cells; (c.) changing (e.g., incrementing or decrementing) a voltage level of a reference signal applied to sense amplifiers; (d.) using the sense amplifiers to sense the bit line voltages; and (e.) determining whether a data signal output from the sense amplifier represents the data value. Steps (c.), (d.), and (e.) are generally repeated until step (e.) determines that the data signal represents the data value. Repetition of the reading out of the bit line voltage is not required if the sense amplifiers do not disturb the bit line voltages. Otherwise, read out step (b.) is also repeated.

Another method for evaluating the bit line voltage includes: determining a first value that corresponds to the highest of the bit line voltages $V0$ that results from reading the ferroelectric memory cells that store a first bit value; and determining a second value that corresponds to the lowest of the bit line voltages $V1$ that results from reading the ferroelectric memory cell that stores a second bit value. The reference value for the reference voltage generator is then selected to be between the first and second values and may be equal to an average of the first and second values.

While evaluating the bit line voltages, operation of the memory can further include: identifying a set (e.g., an array, a row, a column, or an individual FeRAM cell) of the ferroelectric memory cells that the evaluation of the bit line voltages indicates includes one or more weak ferroelectric memory cells; and replacing the set of the ferroelectric memory cells with a set of redundant memory cells.

BRIEF DESCRIPTION OF THE DRAWINGS

Use of the same reference symbols in different figures indicates similar or identical items.

DETAILED DESCRIPTION

In accordance with an aspect of the invention, a FeRAM performs a dynamic calibration of the voltage level or levels of reference signals used for read operation. The dynamic calibration tracks the variations of the ferroelectric capacitors in FeRAM cells by effectively measuring the bit line voltages generated during operation of FeRAM cells. No dedicated reference cells are required because the memory cells themselves are tested for selection of the reference voltage.

Figure 2:
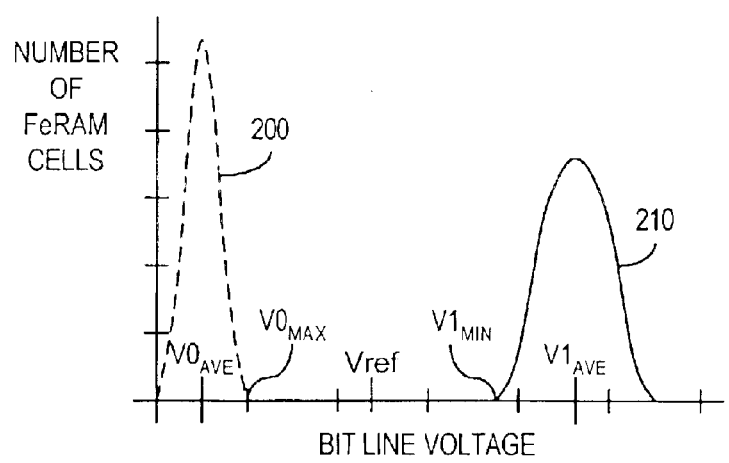
FIG. 2 shows a typical distribution of bit line voltages achieved when reading FeRAM cells.

One embodiment of the dynamic calibration of a reference voltage has an evaluation phase and an equating phase. The evaluation phase measures charge distributions such as illustrated in FIG. 2, and the equating phase sets a voltage level for a reference signal VREF according to the measured distribution. For a simple characterization of the charge distribution, one specific embodiment of the evaluation phase measures the output bit line voltages V0 for a set of memory cells storing bit value 0 to determine a maximum bit line voltage V0max and measures bit line voltages V1 for a set of memory cells storing bit value 1 to determine the minimum bit line voltage V1min. The equating phase can then set a voltage level of the reference signal VREF equal to the average of the two worst-case values V0max and V1min.

The logic that performs reference voltage calibration can determine the charge distribution of all FeRAM cells, just FeRAM cells in a specific memory bank, just FeRAM cells in a specific row or column, or any selected sample of the FeRAM cells. The FeRAM can thus perform different reference voltage calibrations for different sets of FeRAM cells and may have a single reference voltage or different reference voltages for respective memory banks or sections of FeRAM cells.

The calibration process is performed periodically to track the variations in the performance of the FeRAM cells and update the voltage level of reference signal VREF. Calibration is preferably transparent to the user. For example, the calibration process may only be initiated at startup or after a period of inactivity. Before calibration begins, data stored in FeRAM cells being evaluated can be temporarily stored in a buffer or an unused memory array, which during the reference voltage calibration process becomes accessible in place of FeRAM cells being measured. If an external memory access arises during a calibration process, the calibration process can be aborted.

Figure 1:
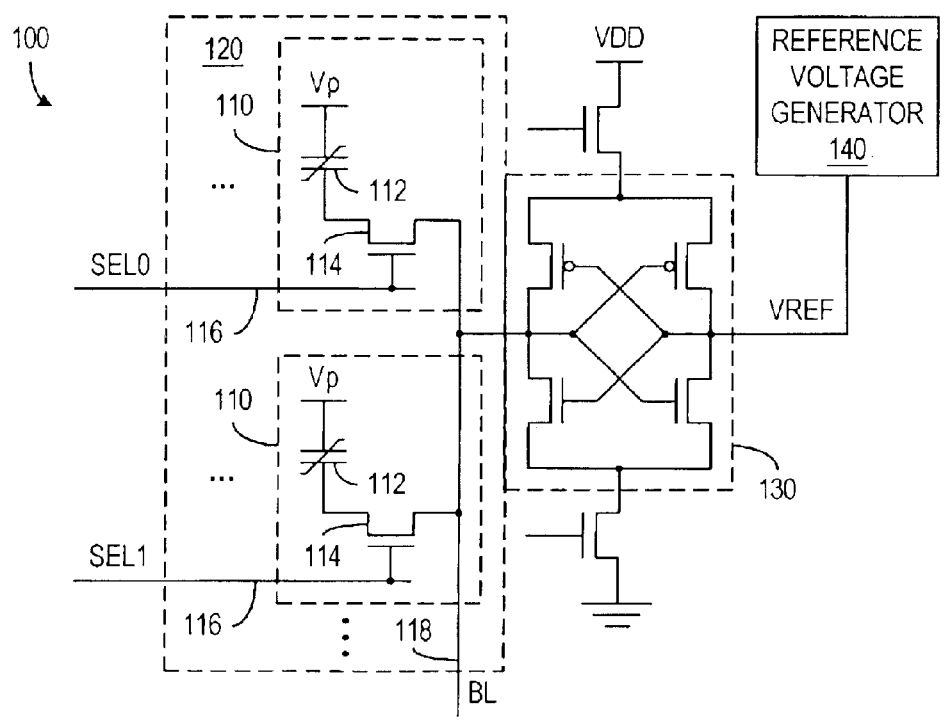
FIG. 1 illustrates a conventional FeRAM employing compact memory cells, each containing a single ferroelectric capacitor.
Figure 3:
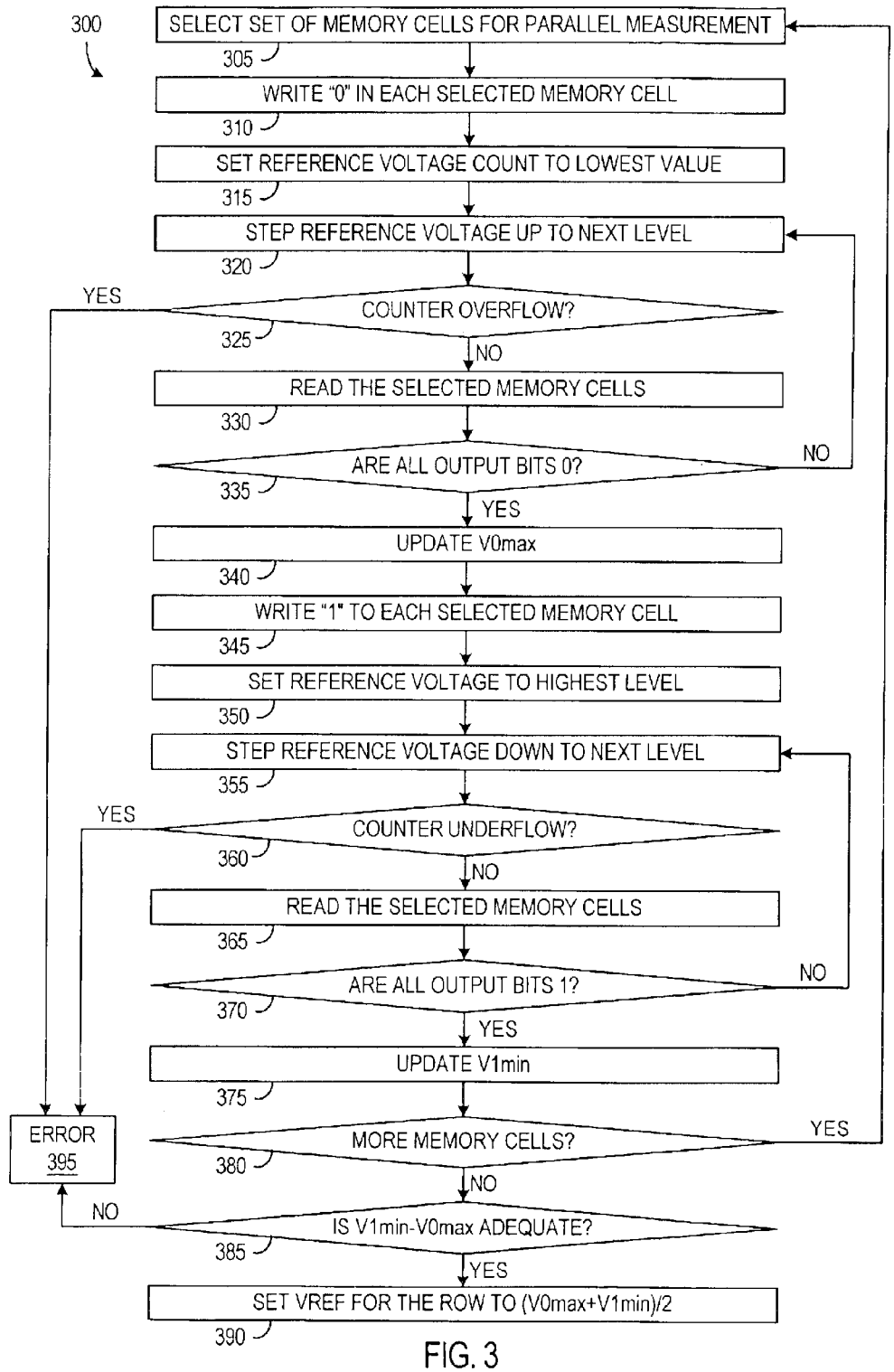
FIG. 3 is a flow diagram of a reference voltage calibration process in accordance with an embodiment of the invention.

FIG. 3 illustrates a reference voltage calibration process 300 for a FeRAM. Although the specific example of performing process 300 in FeRAM 100 of FIG. 1 is described, reference voltage calibration processes can be also be performed in other FeRAM designs.

Process 300 of FIG. 3 begins in a step 305 with the selection of a set of FeRAM cells 110 that can be simultaneously read. In one embodiment of the invention, reference voltage calibration selects one row of FeRAM cells 110 at a time from a selected array or sub-array. Step 310 then writes bit value 0 into each of the selected FeRAM cells 110, and step 315 sets a reference voltage counter (e.g., a 7-bit counter) to a level that provides the lowest voltage level for reference signal VREF.

A loop including steps 320, 325, 330, and 335 is then executed. For each repetition of the loop, step 320 increments the reference signal VREF to the next voltage level by incrementing the count corresponding to reference signal VREF. Step 325 then determines whether incrementing in step 320 causes a counter overflow that would signal an error. A counter overflow indicates reference signal VREF has an unacceptably high voltage level, resulting in an error. If the incremented reference voltage is in the tolerable range, step 330 operates sense amplifiers 130 generating a multi-bit data output signal. The data signal will correctly represent all zeros, the values written in the selected memory cells in step 310, if reference signal VREF has a voltage level higher than all of the read output bit line voltages V0. If data signal does not represent all zeros, process 300 loops back from step 335 to step 320 and increases the voltage level of reference signal VREF. When the output data signal first represents all zeros, the current voltage level of reference signal VREF provides an upper bound for the read out voltages V0 for the currently selected set of FeRAM cells.

Step 340 updates the value of worst-case voltage V0max after step 335 identifies the maximum bit line voltages V0 for the currently selected FeRAM cells. In particular, a stored value of V0max is set to the reference voltage count if the reference voltage count is greater than the stored value of V0max. Otherwise, the stored level for V0max remains unchanged.

Steps 345 to 375 similarly update worst-case value V1min. In particular, step 345 writes bit value 1 to each of the selected memory cells, and step 350 sets the counter that controls the voltage level of reference signal VREF to its maximum value. A loop including steps 355, 360, 365, and 375 decreases the voltage level of reference signal VREF (step 355), checks for a counter underflow or error indication (step 360), reads the selected memory cells (step 365), and determines (step 370) whether any of bit line voltages V1 are lower than the current level of reference signal VREF. If the bits read from the selected memory cells are not all ones, process 300 loops from step 370 back to step 355 and decrements the voltage level of reference signal VREF. When the voltage level of reference signal VREF first drops below the lowest bit line voltage V1, all the output data bits will be ones, and the voltage level of signal VREF indicates the minimum of the read voltages V1. Step 375 sets the stored worst-case value V1min equal to the count for reference signal VREF if the count is less than a previously stored value of V1min.

Step 380 of process 300 determines whether another set of FeRAM cells should be selected for measurement. If so, process 300 branches from step 380 back to step 305 to select the next set of FeRAM cells. In this fashion, the evaluation phase of process 300 can determine worst-case values V0max and V1min for all or a part of a FeRAM array.

Step 385 determines whether the difference between values V1min and V0max is acceptable. A negative difference (i.e., V0max greater than V1min) indicates that read operations will sometimes generate a data error regardless of the choice of the reference voltage. A difference that is too small indicates that read operations may be undependable. If the difference is unacceptable, process 300 asserts an error condition 395. As described further below, reference voltage calibration circuitry that asserts error 395 (e.g., from step 325, 360, or 385) can be coupled to redundancy circuitry capable of replacing FeRAM cells that generate problematic bit line voltage V0 or V1.

If acceptable values V0max and V1min for FeRAM cells in the desired portion of the FeRAM are found, step 390 sets the voltage level to be used for reference signal VREF during read operations. In the example of FIG. 3, the voltage level for reference signal VREF is set to a point halfway between the worst-case values V0max and V1min.

Reference voltage calibration process 300 is subject to wide variations in keeping with the invention. For example, instead of just measuring the worst-case values V0max and V1min, histograms of bit line voltages V0 and V1 can be generated and analyzed for determination of the best voltage for reference signal VREF. Further instead of writing all zeros or all ones in the memory cells and separately determining the highest value for bit line voltage V0 and the lowest value for bit line voltage V1, any known data pattern can be written into the selected set of memory cells (e.g., a row) and then read back for different voltage levels of reference signal VREF. Analysis of output data signals indicates which voltage levels cause errors and permit selection of the optimum voltage of reference signal VREF.

Measuring the charge distribution during reference voltage calibration can be conducted as above by stepping the applied reference voltage for a series of read operations. However, conventional read operations for FeRAM can change the polarization state of the ferroelectric capacitors in the FeRAM cells being read, so that each read operation generally includes a write-back operation that rewrites the known value back to each FeRAM cell. Such read operations are time consuming. Additionally, the repeated read/write cycling of FeRAM cells can fatigue the FeRAM cells and result in inconsistent measurements. Use of a comparator-type sense amplifier that can compare a series of reference voltages to the bit line voltage maintained on the bit line after a single readout of charge reduces measurement time, reduces FeRAM cell fatigue, and improves accuracy.

Figure 4:
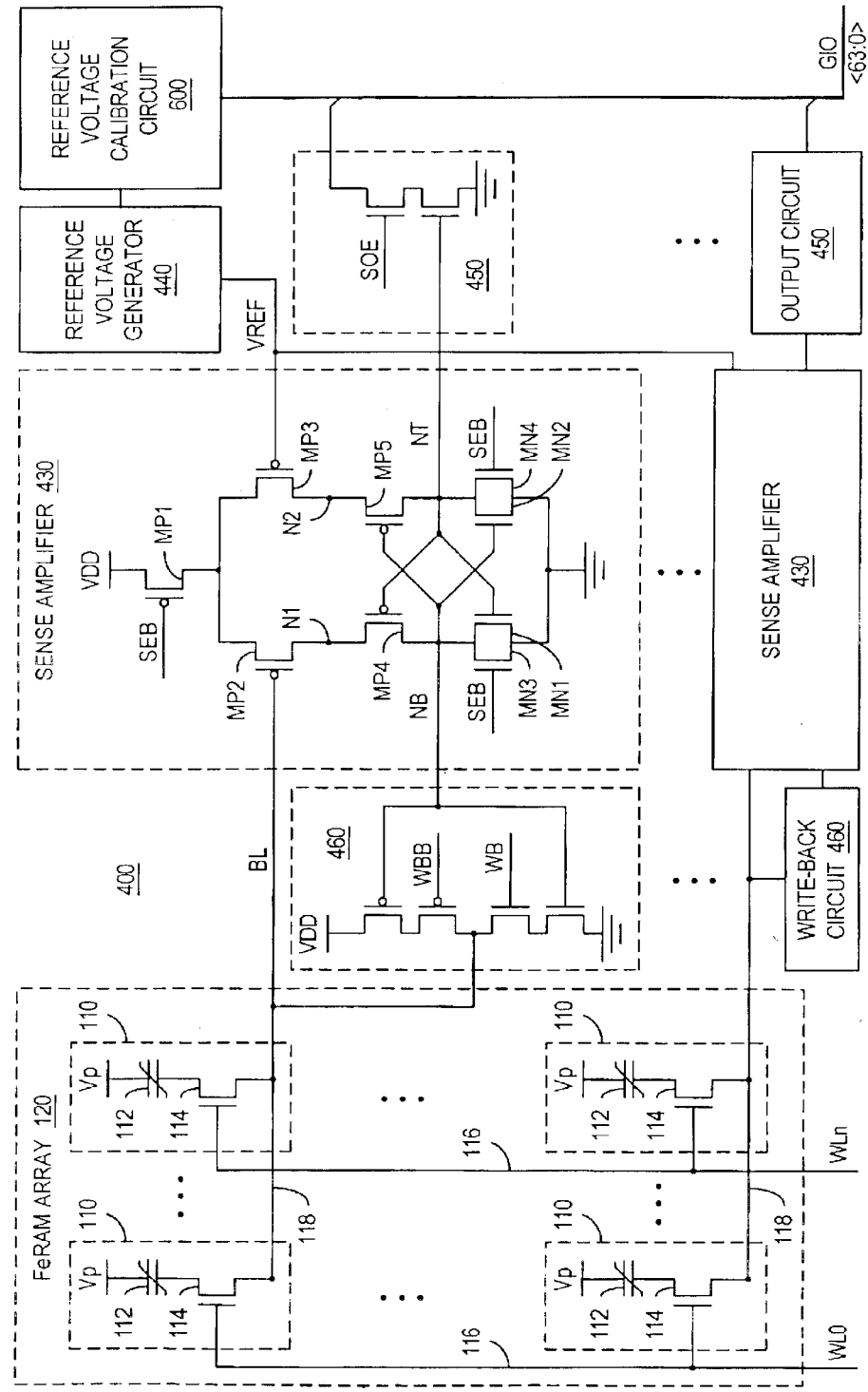
FIG. 4 illustrates a FeRAM employing a calibration circuit, compact memory cells and sense amplifiers that facilitate measurement of bit line voltage distributions for a calibration operation.

FIG. 4 shows a portion of a FeRAM 400 employing comparator-type sense amplifiers 430 that facilitate fast charge distribution measurements. FeRAM 400 contains a FeRAM array 120, sense amplifiers 430, a reference voltage generator 440, global output drivers 450, and write-back circuits 460.

FeRAM array 120 can be a conventional array of FeRAM cells 10 that are organized into rows and columns. Each FeRAM cell 110 includes a ferroelectric capacitor 112 and a select transistor 114, which can be fabricated using known techniques. Bit lines 116 connect to drains of select transistors 114 of FeRAM cells 110 in respective columns of memory array 120. Word lines 118 connect to the gates of select transistors 114 in respective rows of FeRAM array 120, and row decoder and driver circuits (not shown) control signals WL0 to WLn on word lines 118 during write, read, and distribution measurement operations. FeRAM array 120 can be one of several local arrays in a memory architecture having local and global decoding circuits (not shown) and having data paths including global input/output lines that connect the local arrays for data input and output.

Each sense amplifier 430 of FIG. 4 is a comparator-type sense amplifier that connects to the corresponding bit line 118. Alternatively, each sense amplifier 430 can connect to local column decoding circuitry that selectively connects one of multiple bit lines 118 to the sense amplifier 430 for sensing operations.

FIG. 4 further illustrates one implementation of comparator-type sense amplifier 430. The illustrated embodiment includes p-channel transistors MP1, MP2, MP3, MP4, and MP5 and n-channel transistors MN1, MN2, MN3, and MN4. Transistor MP1 serves to activate and deactivate sense amplifier 430 in response to a sense enable signal SEB and is between a supply voltage VDD and transistors MP2 and MP3. Transistors MP2, MP4, and MN1 are connected in series between transistor MP1 and ground, and transistors MP3, MP5, and MN2 are similarly connected in series between transistor MP1 and ground. Transistors MN3 and MN4 are connected in parallel with transistors MN1 and MN2, respectively, and respond to sense enable signal SEB by grounding respective nodes N1 and N2 in preparation for a sensing operation.

The gates of transistors MP2 and MP3 respectively receive input signals BL and VREF from the corresponding bit line 118 and reference voltage generator 440 respectively. Signal BL is the bit line voltage V0 or V1 and depends on the charge read from a FeRAM cell 110 onto the bit line 118 connected to sense amplifier 430. Reference signal VREF has a voltage that reference voltage generator 440 sets. Reference voltage generator 440 can be any circuit capable of generating a series of different voltage levels for signal VREF during distribution measurement and capable of generating a selected one of the voltage levels for read operations after reference voltage calibration. Reference voltage generator 440 is preferably a digitally controlled voltage source having an output voltage that depends on a count (e.g., a 7-bit value) stored in a counter or register associated with reference voltage generator 440. A calibration circuit 600, which is described further below, connects to and sets one or more of the registers that select the voltage level of reference signal VREF.

A voltage difference between bit line signal BL and reference signal VREF determines whether transistor MP2 or MP3 is more conductive, which in turn influences whether the voltage on node N1 between transistors MP2 and MP4 or the voltage on node N2 between transistors MP3 and MP5 rises more quickly when sense amplifier 430 is activated. Both transistors MP4 and MP5 are initially on during a sensing operation, so that an output signal NB from a node between transistors MP4 and MN3 and an output signal NT from a node between transistors MP5 and MN4 initially rise at rates depending on the rise in the voltages on nodes N1 and N2, respectively. The gates of transistors MP4, MP5, MN1, and MN2 are cross-coupled, so that transistors MP4, MP5, MN1, and MN2 amplify a voltage difference that develops between output signals NB and NT. As a result, output signal NT is complementary to output signal NB when the sensing operation is complete.

Output circuit 450 receives output signal NT from sense amplifier 430 and in response to an output enable signal SOE drives a global output signal GIO to a level indicating whether bit line signal BL has a voltage greater than the voltage of reference signal VREF. In an exemplary embodiment, global output signal GIO is pre-charged to supply voltage VDD, and when output enable signal SEO is activated, output circuit 150 pulls signal GIO down or not depending on the voltage level of output signal NT. During a bit line voltage measurement when reference voltage VREF steps through a series of levels, global output signal GIO sequentially indicates a series of binary values representing the results from comparing bit line signal BL to the series of voltage levels of reference signal VREF.

Write-back circuit 460 receives complementary output signal NB, and at the end of a read operation, drives bit line 118 to the appropriate level for writing the data value read from a FeRAM cell back into the FeRAM cell. In FIG. 4, write-back circuit 460 is a tri-state inverter that drives bit line 118 in response to complementary write-back signals WB and WBB. For the distribution measurement, the write-back can be skipped if data is stored in FeRAM cells solely for the distribution measurement. Alternatively, the write-back can be performed after the bit line voltage has been compared to each of the voltage levels of reference signal VREF.

Figure 5:
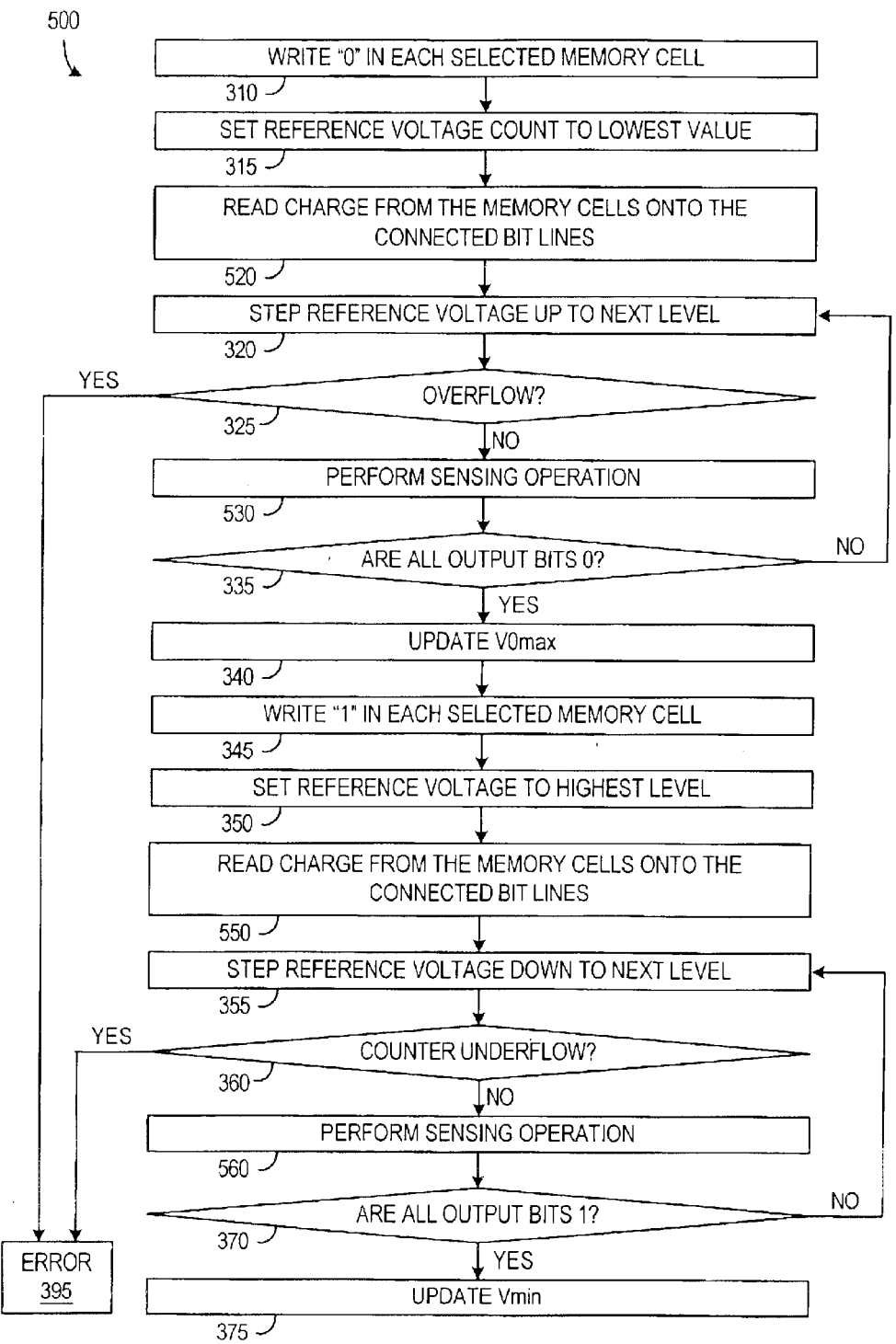
FIG. 5 is a flow diagram of a reference voltage calibration process in accordance with an embodiment of the invention that requires few read/write cycles.

The evaluation phase of process 300 of FIG. 3 can be sped up using comparator-type sense amplifiers such as sense amplifiers 430 of FeRAM 400. FIG. 5 is a flow diagram of a modified evaluation phase 500 suitable for use in memory 400. Evaluation phase 500 begins with writing bit value 0 in the selected FeRAM cells (step 310) and setting the reference voltage count to its lowest level (step 320), which are conducted as described above. Step 520 then reads charge out of the selected FeRAM cells and charges the corresponding bit lines to voltages V0.

A loop including steps 320, 325, 530, and 335 is then performed one or more times while the bit lines hold the readout voltages V0. Steps 320 and 325 step the reference voltage to the next level and check for errors. Step 530 is a sensing operation that compares the bit line voltages to the current voltage level of the reference signal VREF. Step 335 causes a repetition of the loop unless the data output signal that the sensing operation 530 generates represents all zeros. Process 500 thus exits the loop if the voltage level of reference signal VREF is greater than the highest of the bit line voltages V0. Step 340 then updates the worst-case value V0max.

Evaluation phase 500 has the advantage of only requiring a single charge readout for measurement of the bit line voltage. The FeRAM cells thus accumulate less fatigue. Further, sensing operation 530 is faster than a full read operation, which reduces the time required for reference voltage calibration. Evaluation phase 500 achieves similar time savings and reduces fatigue in the measurement of the worst case value V1min by reading out the bit line voltages V1 once in step 550 and replacing a full read operation (step 365 in FIG. 3) with a sensing operation (step 560 in FIG. 5). These advantages result because the comparator-type sense amplifiers do not change or disturb the bit line voltages V0 or V1.

Figure 6:
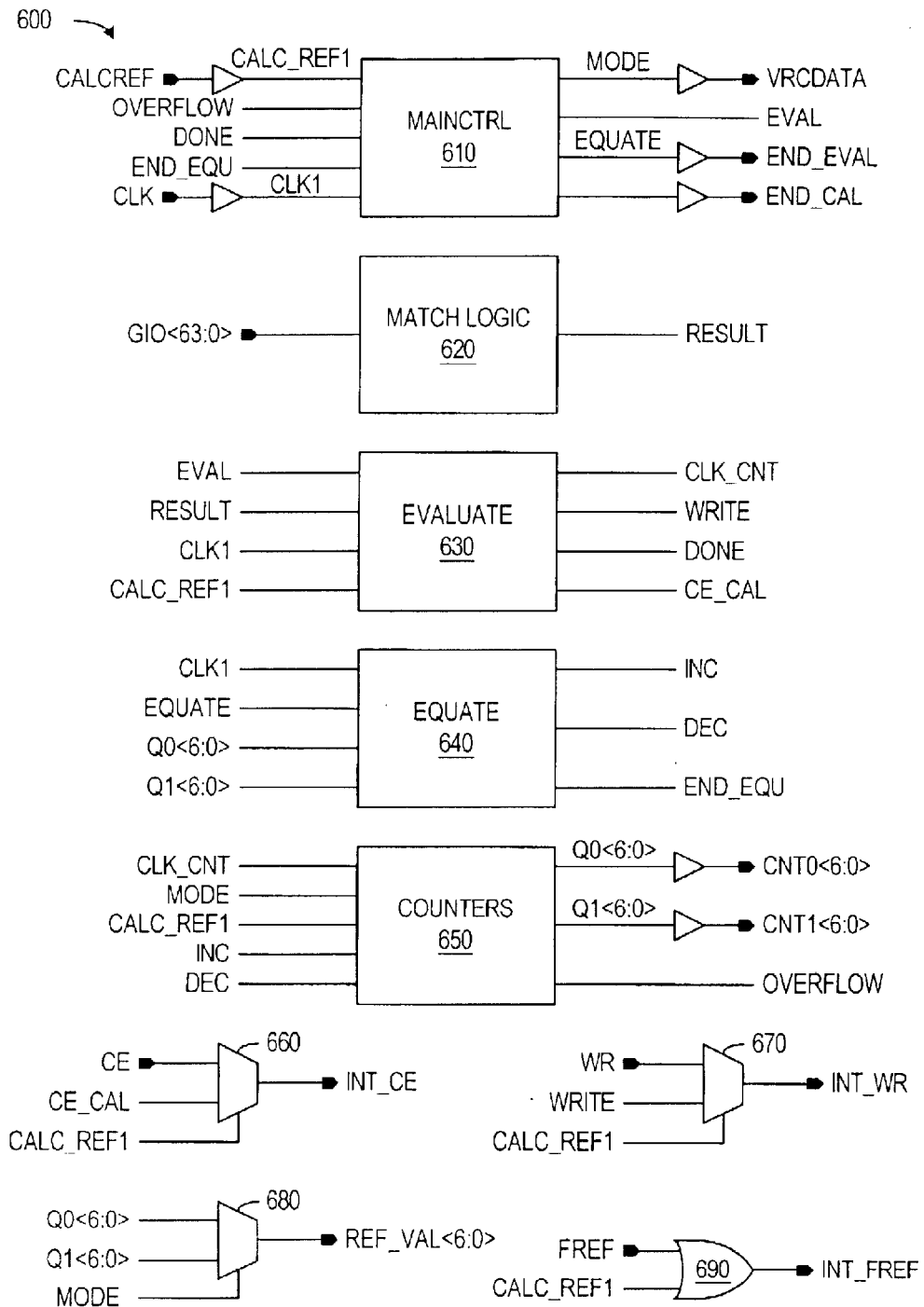
FIG. 6 is a block diagram of a reference voltage calibration circuit in accordance with an embodiment of the invention.

FIG. 6 is a block diagram of an embodiment of calibration circuit 600 that implements dynamic reference voltage calibration in accordance with an embodiment of the invention. During a calibration operation, calibration circuit 600 receives a clock signal CLK, data signal GIO<63:0>, a chip enable signal CE, a calculation initiation signal CALC_REF, a write signal WR, and a reference mode signal FREF. Calibration circuit 600 generates signals INT_CE, INT_WR, INT_FREF, VRCDATA, and REF_VAL<6:0> for control of read and write circuits during the evaluation phase of the reference voltage calibration and generates signals END_EVAL, END_CAL, CNT0<6:0>, and CNT1<6:0> to indicate the status and the results of the reference voltage calibration. Table 1 summarizes the functions of the interface signals between the rest of the FeRAM and calibration circuit 600.

TABLE 1

Input/Output Signals of Reference Voltage Calibration Circuit

| Signal Name | I/O | Description |
|---|---|---|
| CLK | I | Clock signal |
| CALC_REF | I | Initiates the calibration process on the rising edge |
| CE | I | Chip-enable |
| WR | I | Write/read signal |
| FREF | I | 0: Do not use reference voltage from calibration circuitry for normal memory operation; 1: Use the reference voltage from the calibration circuitry for normal memory operation |
| REF_VAL<6:0> | O | The calibrated reference voltage (digital representation) |
| INT_CE | O | Internal memory chip enable |
| INT_WR | O | Internal memory write/read |
| INT_FREF | O | Internal FREF |
| VRCDATA | O | Holds the data that is written to the memory row during calibration |
| CNT0<6:0> | O | Holds the reference voltage value of the '0' level |
| CNT1<6:0> | O | Holds the reference voltage value of the '1' level |
| END_EVAL | O | Indicates the end of the evaluation process (rising edge) |

TABLE 1-continued

Input/Output Signals of Reference Voltage Calibration Circuit

| Signal Name | I/O | Description |
|---|---|---|
| END_CAL | O | The rising edge indicates the end of the calibration process or an error condition if the value of CNT0<6:0>=0 |

Calibration circuit 600 includes a main control block 610, match logic 620, an evaluation block 630, an equate block 640, counters 650, signal selection circuits 660, 670, 680, and 690. Main control block 610 is a state machine that controls the reference voltage calibration process. Match logic 620 compares a read data value represented by signal GIO<63:0> to the last Written data value and at the end of each sensing operation, generates a signal RESLT indicating whether the read data value is equal to the last data value written. Evaluation block 630 and equate block 640 are state machines that respectively control the evaluation and equating phases of the reference voltage calibration process. Counters 650 include logic and counters that store counts associated with reference voltages found for bit line voltages V0 and V1. Signal selection circuits 660, 670, 680, and 690 select and output signals for read and write operations during normal operation of the FeRAM and for reference voltage calibration.

Figure 7:
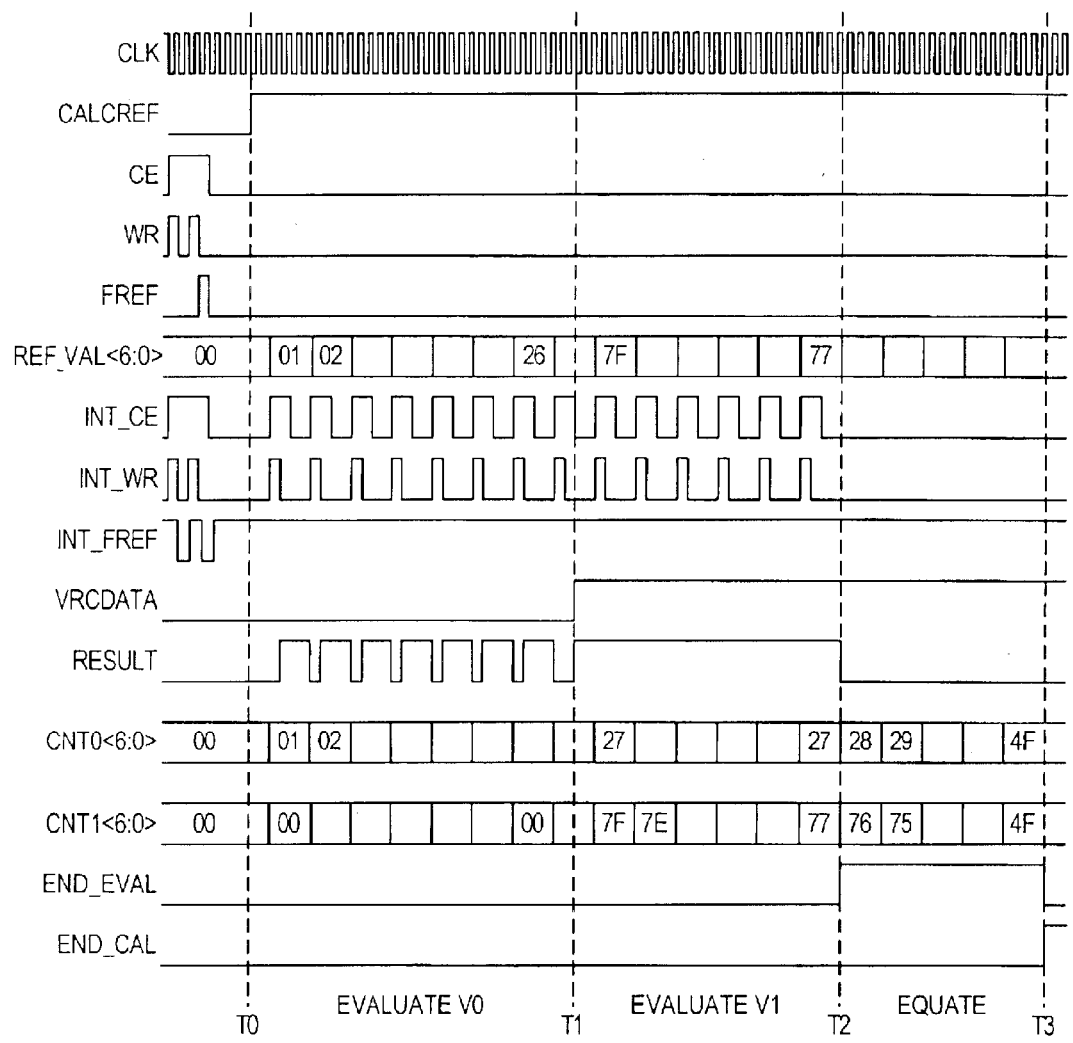
FIG. 7 is a timing diagram for interface signals of the calibration circuit of FIG. 6.

FIG. 7 is a timing diagram illustrating the behavior of the interface signals during a simulated operation of calibration circuit 600. Signals CE, WR, and FREF are a chip enable signal, a write signal, a referencing mode signal and are outputs as signals INT_CE, INT_WE, and NT_FREF from calibration circuit 600 during normal operation, e.g., during normal read and write operations. When signal CALCREF is asserted at time T0, calibration circuit 600 begins a reference voltage calibration process and in particular starts an evaluation phase for bit line voltage V0.

During the evaluation phase, calibration circuit 600 generates signals INT_CE and INT_WR as required for a series of write and read operations. Signal VRCDATA selects the data value (initially 0) written to the selected memory cells, and circuitry (not shown) external to calibration circuit 600 generates the required address for the write and read operations. Signal REF_VAL indicates the reference voltage used during the sensing operations and between times T0 and T1 is equal to count signal CNT0 for evaluation of bit line voltages V0 corresponding to bit value 0. Between times T1 and T2, signal REF_VAL is equal to count signal CNT1 for evaluation of bit line voltages V1 corresponding to bit value 1. Match logic 620 during the evaluation stage (between times T0 and T2) asserts a signal RESULT at the end of each sensing operation to indicate whether the data value read by the sensing operation is equal to the last value written in the selected FeRAM cells. In this simulation of FIG. 7, the minimum value of signal REF_VAL providing an accurate sensing of bit values 0 is 27h (or 39) and the maximum value of signal REF_VAL providing accurate sensing of bit values 1 level is 77h (or 119).

The equating phase, which occurs between times T2 and T3, averages the two counts CNT0 and CNT1 to find a best reference voltage value for the selected memory cells. In the example of FIG. 5, averaging both counts CNT0 and CNT1 provides the value 4Fh (or 79).

Returning to FIG. 6, main control logic 610 has the input and output signals summarized in Table 2. Clock signals CLK and CLK1 are unbuffered and buffered versions of the clock signal for main control logic 610 (and calibration circuit 600). Input signal CALC_REF1 is an active low global reset signal for calibration circuit 600. Input signal OVERFLOW from counters 650 indicates (on a rising edge) an error condition when a counter overflows. Input signal DONE is from evaluation block 630 and indicates (on a rising edge) the end of the evaluation phase. Input signal END_EQU from equate block 640 indicates (on a rising edge) the end of the equating phase. Output signal MODE determines the mode (e.g., bit value 0 or 1) of the evaluation phase, and signal VRCDATA is a buffered version of signal MODE that controls the data value written to the selected memory cells in the evaluation phase. Output signal EVAL initiates (on a rising edge) the evaluation phase, and output signal EQUATE initiates (on a rising edge) the equating phase of the calibration process. Output signal END_CAL indicates the end of the calibration process.

TABLE 2

I/O Signals of the Main Control Block for Reference Voltage Calibration Circuit

| Signal Name | I/O | Description |
| --- | --- | --- |
| CALC_REF1 | I | Active low global reset signal for the calibration circuit |
| OVERFLOW | I | Indicates an error condition (rising edge) |
| DONE | I | Indicates end of evaluation (rising edge) |
| END_EQU | I | Indicates end of equating (rising edge) |
| CLK1 | I | Clock signal |
| MODE | O | Determines the mode of the evaluation |
| EVAL | O | Initiates evaluation (rising edge) |
| EQUATE | O | Initiates equating (rising edge) |
| END_CAL | O | Indicates the end of the calibration process |

Figure 8A:
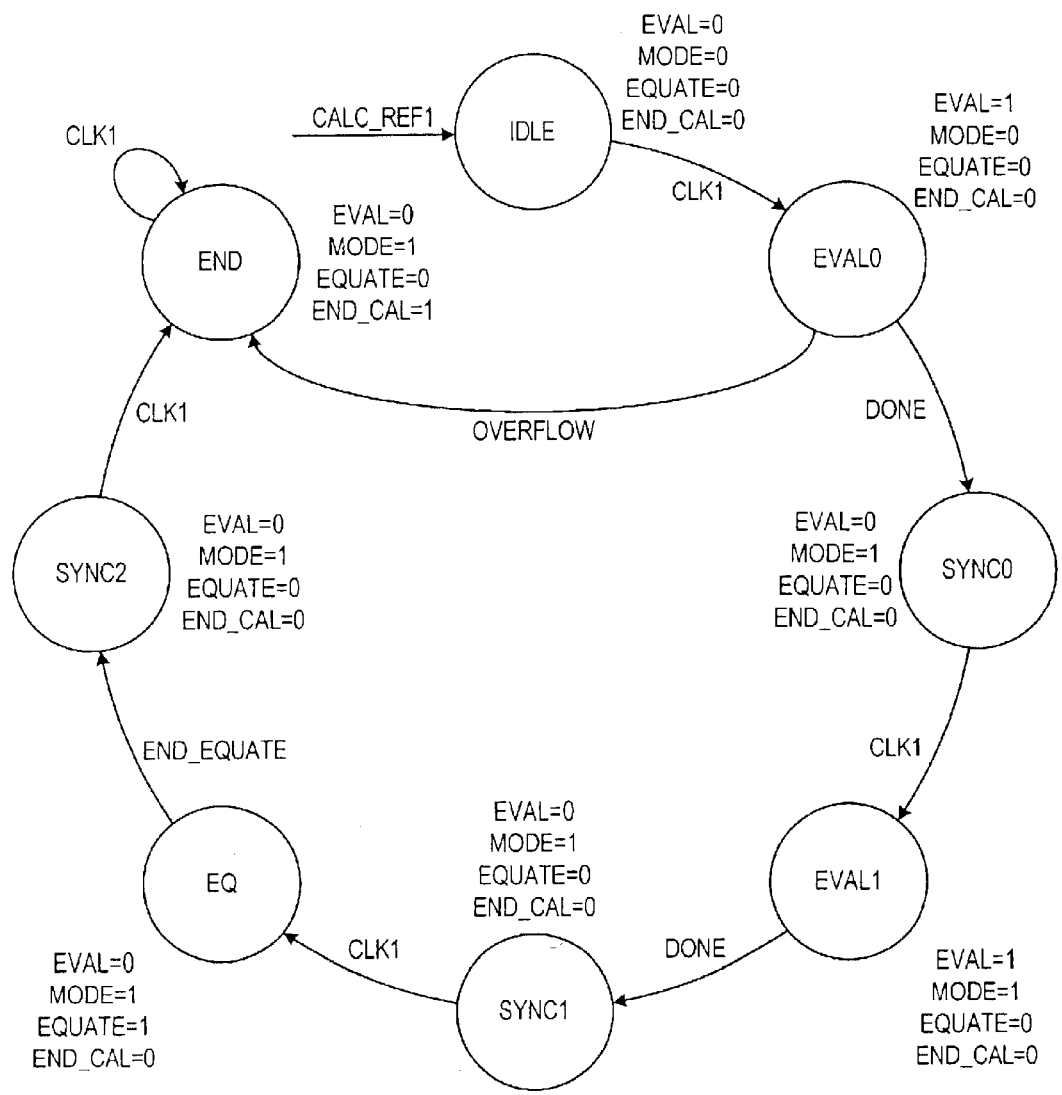
FIGS. 8A and 8B are respectively a state diagram and a circuit diagram for an embodiment of a main control block of the calibration circuit of FIG. 6.

FIG. 8A is a state diagram for an exemplary embodiment of main control block 610. Main control block 610 starts action in state IDLE when signal CALC_REF1 changes to state 0. With the rising edge of clock signal CLK1, block 610 changes to state EVAL0 and sets signal EVAL to initiate the evaluation phase with signal MODE having value 0. Evaluation block 630 controls the evaluation of bit line voltages V0 leaving a result of the evaluation as count CNT0. The rising edge of signal OVERFLOW when in state EVAL0 indicates an overflow in count CNT0, which is an error condition because no suitable reference voltage level was found in the counter range. In this case, the calibration is immediately aborted. The value of count CNT0 differentiates between normal calibration termination and an abortion because of an error. If count CNT0 is 0 when main control block 610 asserts signal END_CAL, an error has occurred, otherwise the value is valid.

The rising edge of signal DONE indicates the end of the evaluation of the bit line voltages V0, and in response, main control block 610 changes to state SYNC0. State SYNC0 is used to synchronize actions in control block 610 with the rising edge of clock signal CLK1. In state SYNC0, signal EVAL has the value 0, and signal MODE changes its value to 1 to prepare for the evaluation of bit line voltages V1. The next rising edge of clock signal CLK1 initiates the evaluation of bit line voltages V1, and main control block 610 changes from state SYNC0 to state EVAL1 during which evaluate block 630 caries out the evaluation of bit line voltages V1 leaving a result of the evaluation as count CNT1.

Main control block 610 changes from state EVAL1 to state SYNC1 on the next rising edge of signal DONE. At this point, the evaluation phase is complete, and the two counts CNT0 and CNT1 correspond to the worst case reference values required for accurate reading of bit values 0 and 1, respectively.

From state SYNC1, the next rising edge of clock signal CLK1 causes main control block 610 to change to state EQ for the equating phase, which averages the two counts. Equate block 640 starts the equating phase with the rising edge of signal EQUATE. The rising edge of signal END_EQU from block 640 indicates the end of the equating phase, and main control block 610 responds by changing from state EQ to state SYNC2 where signal EQUATE is 0. The next clock changes main control block 610 to state END, where END_CAL is set to 1 to indicate the end of the calibration process. As mentioned previously, the value of CNT0 indicates whether calibration circuit 600 succeeded in generating a new reference value.

Figure 8B:
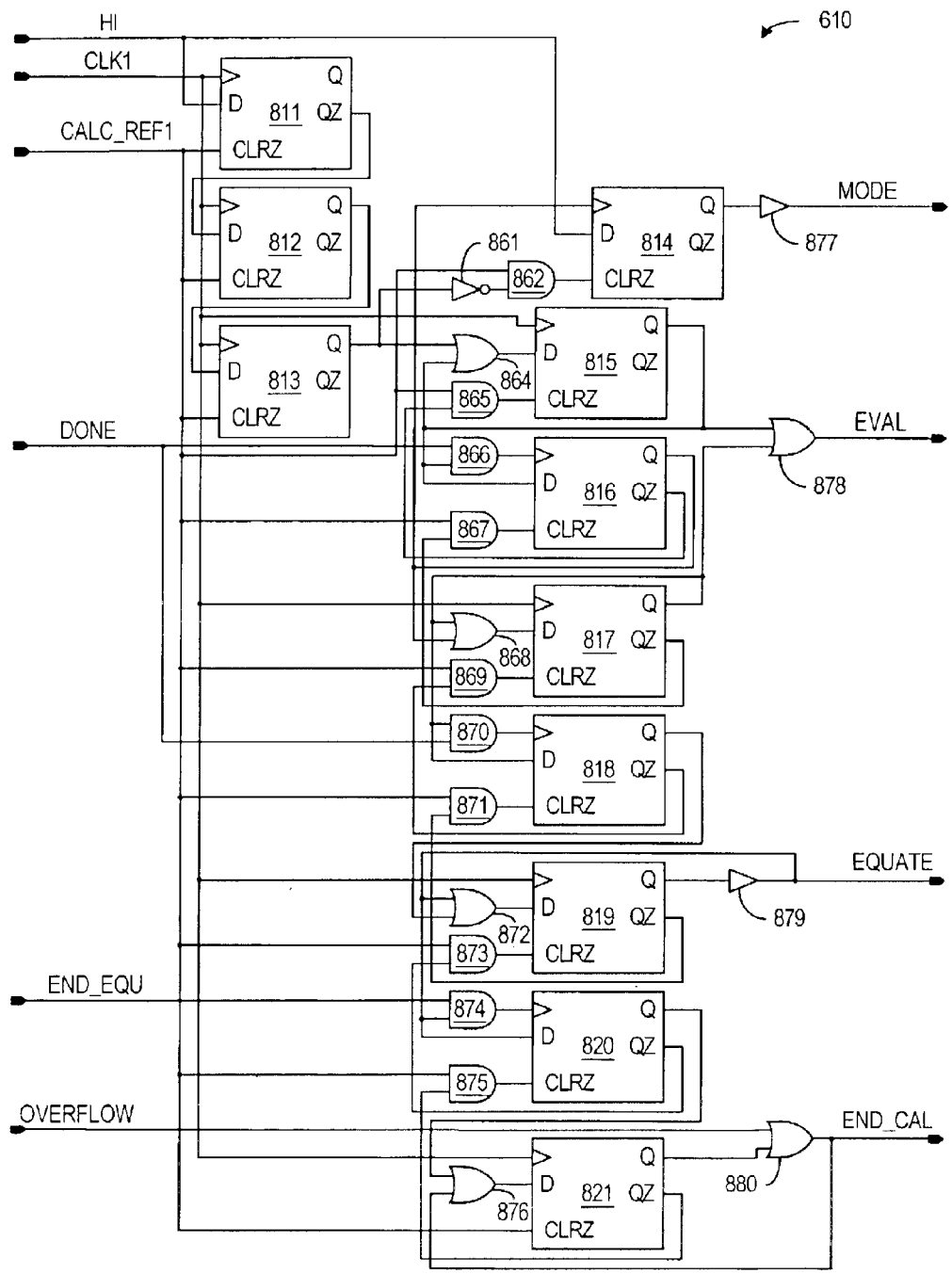

FIG. 8B is a circuit diagram of one implementation of main control logic 610. In the illustrated embodiment, main control block 610 includes a series of flip-flops 811 to 821 and logic gates 861 to 880 that implement the state diagram of FIG. 8A.

Evaluate block 630 controls the evaluation phases of the calibration process. Table 3 summarizes the functions of the input and output signals of evaluate block 630.

TABLE 3

I/O Signals of the Evaluate Block for Reference Voltage Calibration Circuit

| Signal Name | I/O | Description |
| --- | --- | --- |
| EVAL | I | Initiates evaluation with the rising edge |
| RESULT | I | Indicates whether the values read from the memory are identical to the value that has been written. 1: Identical 0: Not Identical |
| CLK1 | I | Clock signal |
| CALC_REF1 | I | Active low reset signal for the calibration circuit, connected with CALC_REF on the top level |
| CLK_CNT | O | Counters clock signal |
| WRITE | O | 0: Data read from the memory; 1: Data written to the memory; Multiplexed with the WR pin on top level. |
| DONE | O | Indicates the end of the evaluation |
| CE_CAL | O | Internal chip enable, multiplexed with CE on top level |

Figure 9A:
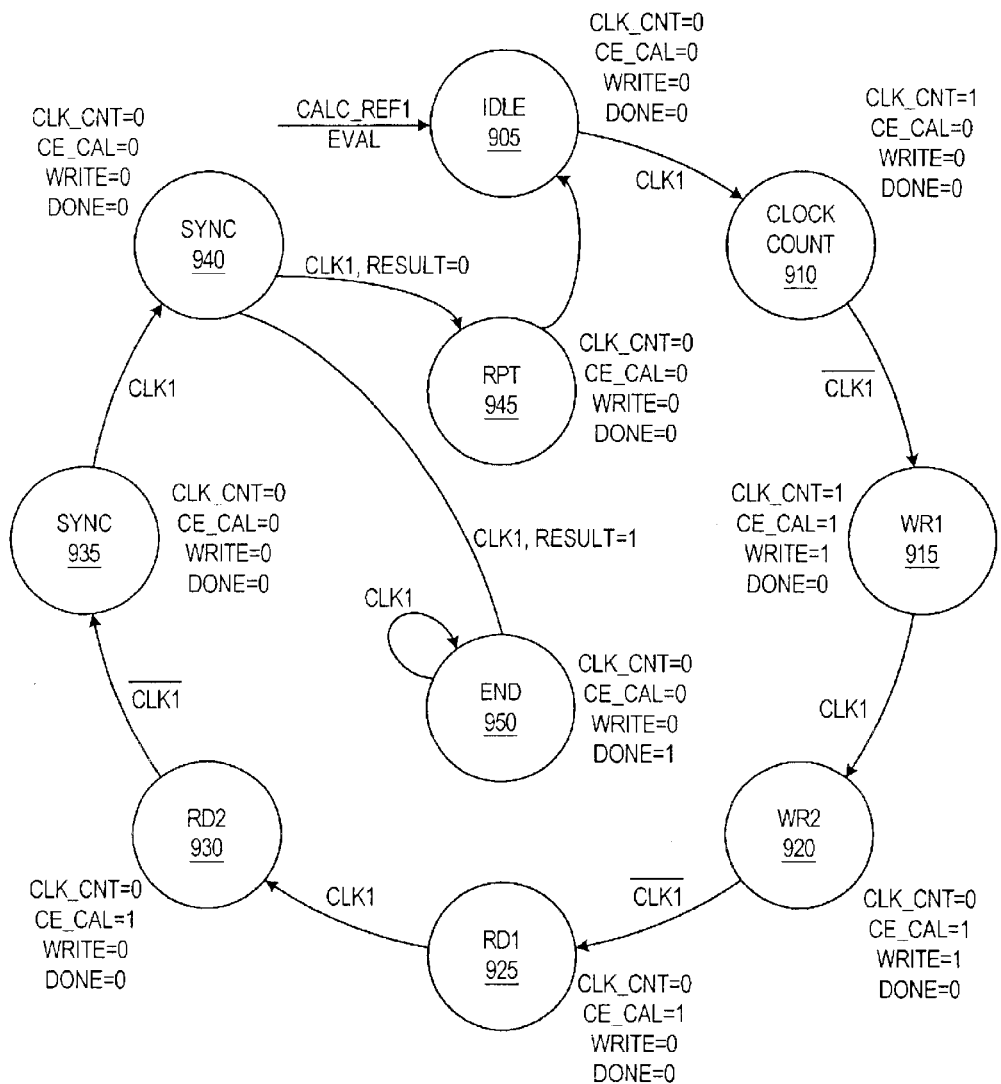
FIGS. 9A and 9B are respectively a state diagram and a circuit diagram for an embodiment of a circuit block that controls evaluation of bit line voltages.

Evaluate block 630 is a state machine that generates the signals required for write and read or sensing operations required for evaluating bit line voltages. FIG. 9A is a state diagram illustrating the operation of evaluate block 630. Evaluate block 630 enters an idle state 905 in response to signal CALC_REF1 and EVAL being both asserted. With the rising edge of clock signal CLK1, evaluate block 630 changes from idle state 905 to a state 910 where counter clock signal CLK_CNT is set to 1. Counters 650 can then increase or decrease count CNT0 or CNT1 according to the value of signal MODE.

With the falling edge of clock signal CLK1, evaluate block 630 changes from state 910 to a first write state 915 and sets signals INT_CE and WRITE to 1. The falling edge of clock signal CLK1 is used because the memory latches signals with the rising edge of clock signal CLK, so that signals are first set with the falling edge and then latched with the rising edge to guarantee sufficient setup time for the latches. Evaluate block 630 changes from the first write state 915 to a second write state 920 at the next rising edge of clock signal CLK1 and starts a write operation in the memory.

With the next falling edge of clock signal CLK1, evaluate block 630 changes from write state 920 to a first read state 925. In state 925, signal WRITE is 0, and INT_CE stays stable. At the rising edge of clock signal CLK1, evaluate block 630 enters the second read state 930, and the values of signals INT_CE and WRITE are latched to start a read operation in the memory.

At the next falling edge of clock signal CLK1, evaluate block 630 changes to a SYNC state 935. Here, signal CE_CAL is set to 0 because no memory access takes place. The next rising edge changes evaluate block 630 to another SYNC state 940, which is a branching point that depends on the signal RESULT. When RESULT is 1, the read data is identical to the written data, which means that the reference voltage is proper for reading the memory locations without errors. Thus, with the next rising edge of clock signal CLK1, evaluate block 630 changes from state 940 to an end state END 950 and asserts signal DONE to 1 to indicate the end of the evaluation.

When signal RESULT is 0, the sensing or read operation gave at least one false data bit, which means that the reference voltage is not yet proper to read all cells without errors. In this case, the reference voltage has to be increased if signal MODE is 0 or decreased if signal MODE is 1 and the evaluation is repeated. Thus, if signal RESULT is 0, evaluate block 630 changes with the next clock from state 940 to state 945, which repeats the evaluation again with a new reference value.

Figure 9B:
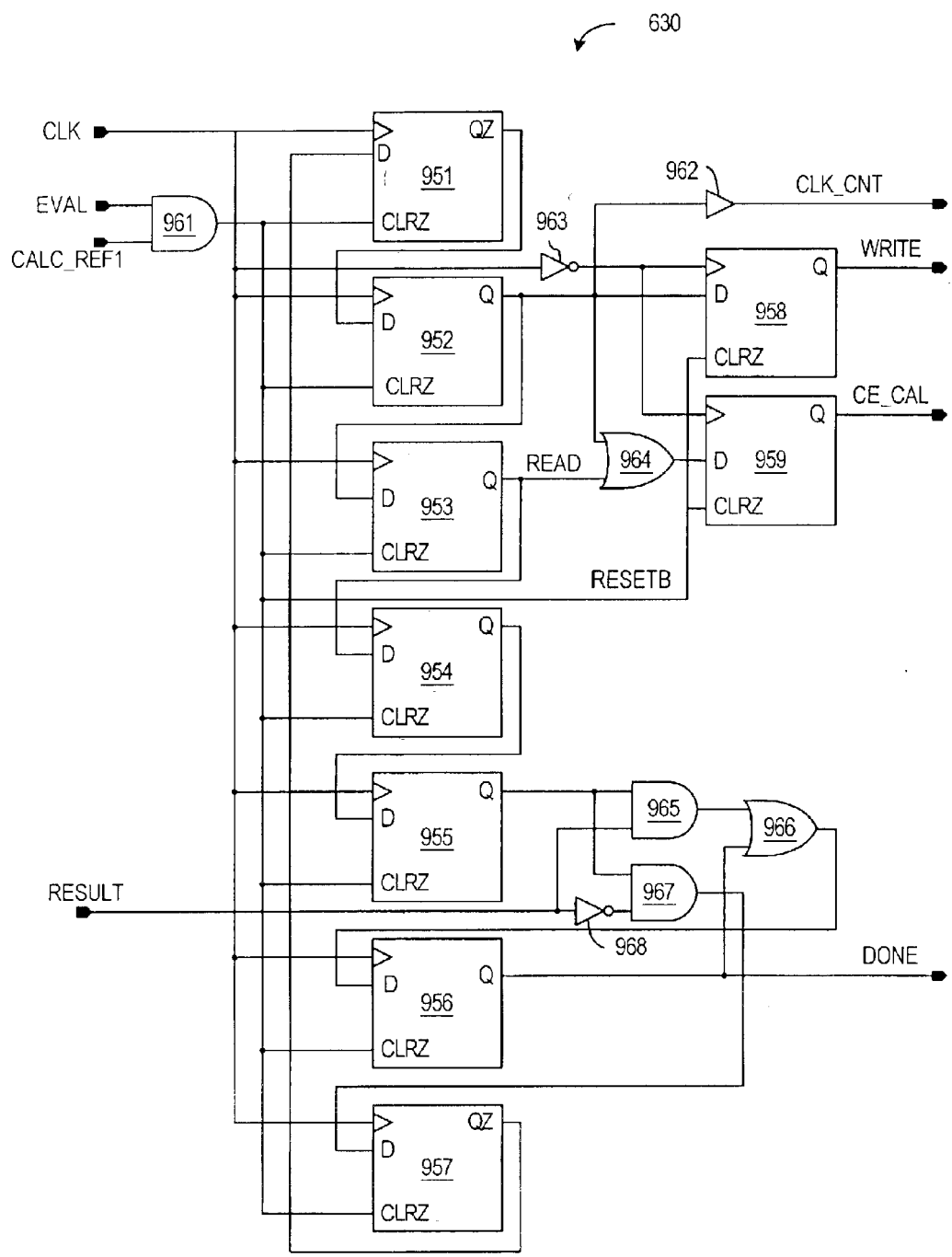

FIG. 9B is a circuit diagram of one implementation of evaluate block 630. In the illustrated embodiment, evaluate block 630 includes a series of flip-flops 951 to 959 and logic gates 961 to 968 that implement the state diagram of FIG. 9A.

Equate block 640 controls equating (or averaging) the values of counts CNT0 and CNT1 that were determined during the evaluation phase. Table 4 lists and summarizes the functions of the input and output signals of equate block 640.

TABLE 4

I/O Signals of the Equate Block for Reference Voltage Calibration Circuit

| Signal Name | I/O | Description |
| --- | --- | --- |
| CLK1 | I | Clock signal |
| EQUATE | I | Initiates the equating process |
| Q0<6:0> | I | Value of CNT0 |
| Q1<6:0> | I | Value of CNT1 |
| INC | O | Clock signal to increase CNT0 |
| DEC | O | Clock signal to decrease CNT1 |
| END_EQU | O | The rising edge indicates the end of the equating process |

Figure 10A:
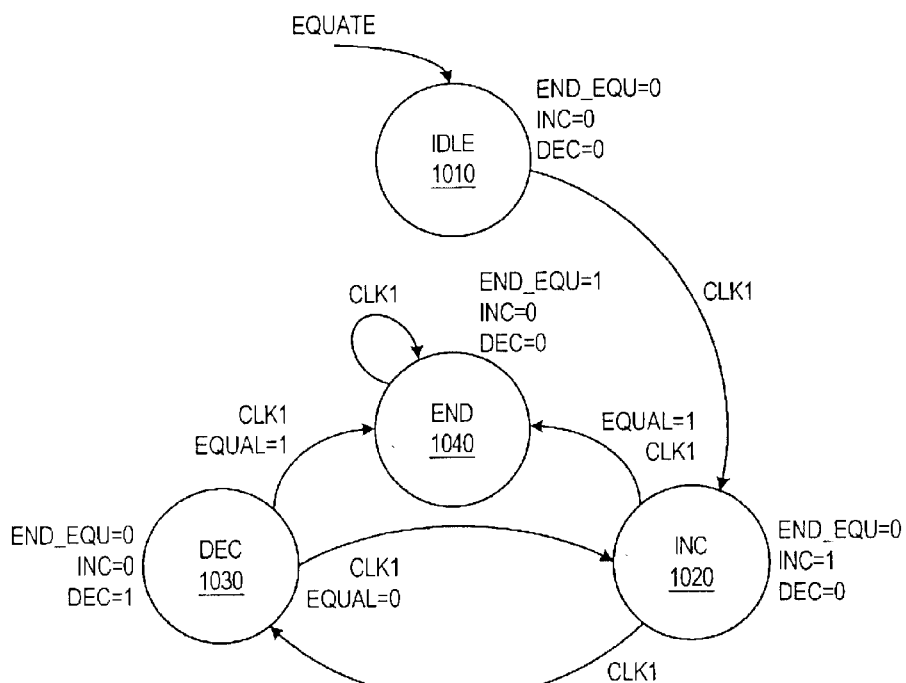
FIGS. 10A and 10B are respectively a state diagram and a circuit diagram for an embodiment of a circuit block that controls averaging of reference values determined during evaluation of bit line voltages.

Equate block 640 contains a state machine that in an exemplary embodiment implements the state diagram of FIG. 10A. Main control block 610 activates equate block 640 by asserting signal EQUATE after the evaluation phase is finished without errors. Equate block 640 then enters an idle state 1010 when counts CNT0 and CNT1 respectively indicate the worst case voltage levels V0max and V1min. At the first rising edge of clock signal CLK1, equate block 640 changes from state 1010 to a state 1020 where signal INC is set to 1 which causes count CNT0 to increase. At this point, counts CNT0 and CNT1 are compared. If counts CNT0 and CNT1 are equal, an internal signal EQUAL is set to 1. Otherwise signal EQUAL is set to 0. At the next rising edge of clock signal CLK1, equate block 640 changes from state 1020 to state 1030 if signal EQUAL is equal to 0 or to an end state 1040 if signal EQUAL is 1.

State 1030 asserts signal DEC causing a decrease in count CNT1. Again, counts CNT0 and CNT1 are compared, and signal EQUAL is set to 1 if counts CNT0 and CNT1 are equal or set to 0 if counts CNT0 and CNT1 differ. From state 1030, equate block 640 changes to state 1020 if signal EQUAL is equal to 0 or to end state 1040 if signal EQUAL is 1 at the next rising edge of clock signal CLK1.

Equate block 640 thus alternates between states 1020 and 1030, incrementing count CNT0 and decrementing count CNT1 until the two counts are equal. Counts CNT0 and CNT1 at the end of the equating phase are thus equal to the average of the values counts CNT0 and CNT1 had at the start of the equating phase. In the end state 1040, signal END_EQU is set to indicate that the equating phase is finished.

Figure 10B:
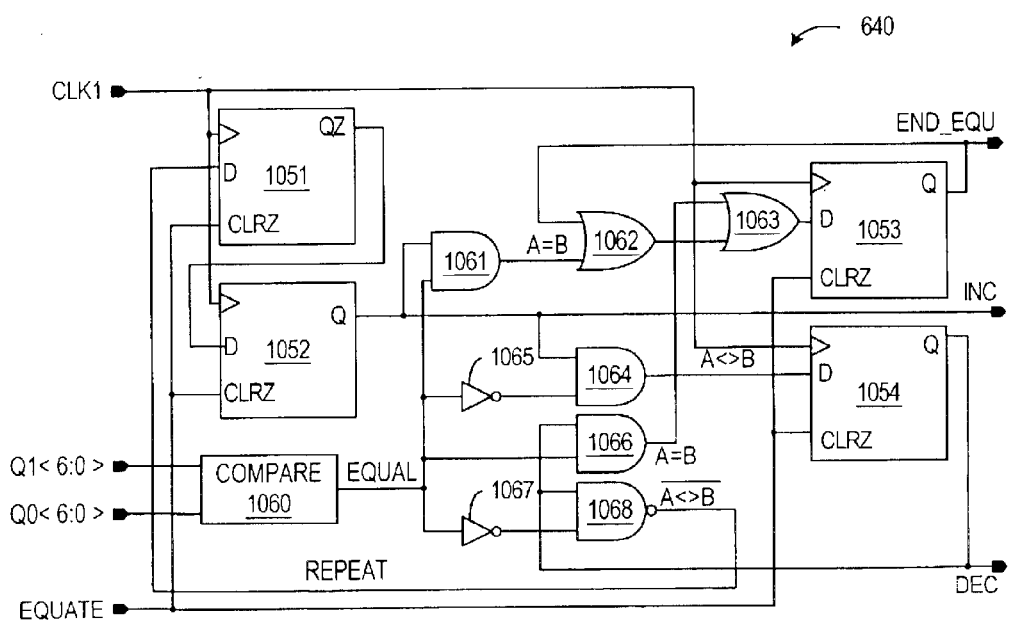

FIG. 10B is a circuit diagram of one implementation of equate block 640. In the illustrated embodiment, equate block 640 includes a comparator 1060 that compares count values Q0 and Q1 to generate internal signal EQUAL. A series of flip-flops 1051 to 1054 and logic gates 1061 to 1068 implement the state diagram of FIG. 10A.

Figure 11:
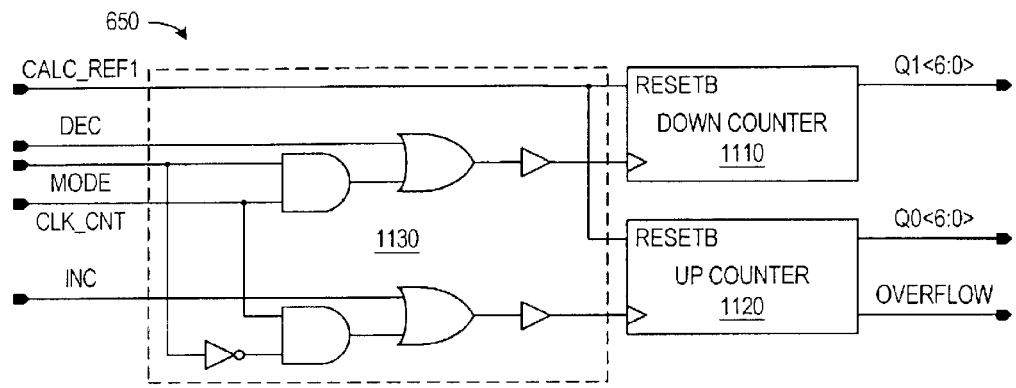
FIG. 11 is a circuit diagram of an embodiment of a counter block for the calibration circuit of FIG. 6.

FIG. 11 shows a schematic of an exemplary embodiment of counters 650. Counters 650 include an up-counter 1120 for count CNT0, a down-counter 1110 for count CNT1, and control logic 1130 that selects which of counters 1110 and 1120 receives a clock signal. Table 5 lists and summarizes the functions of the input and output signals of equate block 640.

TABLE 5

I/O Signals of Counters in the Reference Voltage Calibration Circuit

| Signal Name | I/O | Description |
| --- | --- | --- |
| CLK_CNT | I | Clock signal for counter during evaluation phase |
| MODE | I | Determines which counter is clocked 0: clock is passed to the up-counter 1: clock is passed to the down-counter |
| CALC_REF1 | I | Active low reset signal |
| INC | I | Clock signal to increase CNT0 during equating phase |
| DEC | I | Clock signal to decrease CNT1 during equating phase |
| Q0<6:0> | O | The value of the up-counter (CNT0) |
| Q1<6:0> | O | The value of the down-counter (CNT1) |
| OVERFLOW | O | Indicates an overflow of CNT0 |

During the evaluation of bit line voltages V0 corresponding to storing bit value 0, counter 1120 for count CNT0 is clocked because signal MODE is 0, and during the evaluation of bit line voltage V1 corresponding to storing bit value 1, counter 1010 for count CNT1 is clocked because signal MODE is 1. Similarly, during evaluation of bit line voltages V0, count CNT0 is output as signal REF_VAL for control of the voltage level of reference signal VREF, and during evaluation of bit line voltages V1, count CNT1 is output as signal REF_VAL for control the voltage level of reference signal VREF.

An overflow occurs when no proper value is found for bit line voltages V0 corresponding to store bits of value 0. The exemplary embodiment does not detect an erroneous level for bit line voltage V1 associated with bit value 1, but alternative embodiments of the invention could include such detection.

Figure 12:
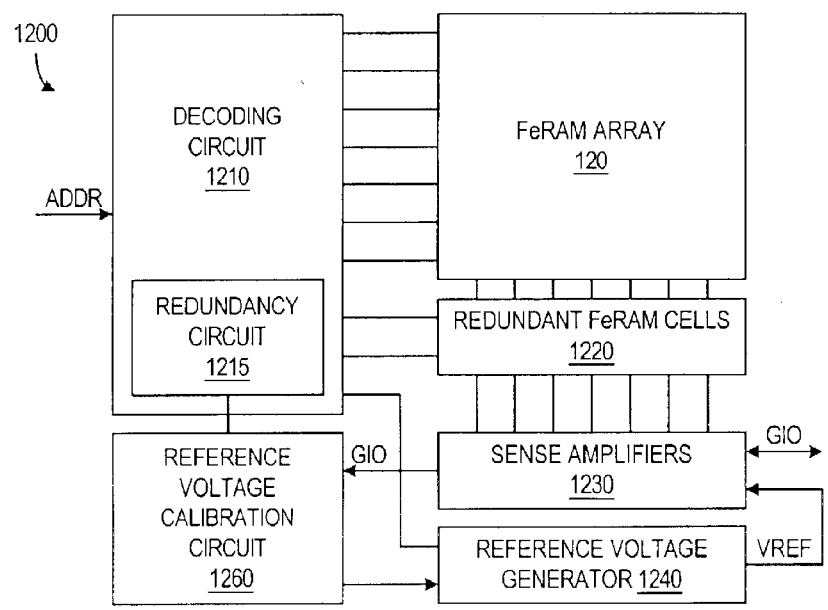
FIG. 12 is a block diagram of a FeRAM in accordance with an embodiment of the invention having redundancy circuitry connected to a reference voltage calibration circuit.

In accordance with another aspect of the invention, the reference voltage calibration circuitry can be connected to and used with an on-chip redundancy circuitry. FIG. 12, for example, shows a block diagram of a memory 1200 including a reference voltage calibration circuit 1260 and a redundancy circuit 1215. Reference voltage calibration circuit 1260 periodically performs reference voltage calibration for a set (e.g., a row) of FeRAM cells that decoding circuits 1210 select in FeRAM array 120. A successful calibration process results in the storage of a digital value that reference voltage generator 1240 used when generating a reference voltage reading memory cells associated with the calibration. FIG. 12 illustrates that reference voltage generator 1240 can be connected to address decoding circuits 1210, and provides to sense amplifiers 1230 a reference signal VREF having a voltage level that is best for the FeRAM cells indicated by an address signal ADDR.

Reference voltage calibration circuit 1260 can detect weak or failing FeRAM cells if a counter overflow occurs during the evaluation process or by comparing a reference count (e.g., count CNT0 or CNT1) after the evaluation phase with an acceptable range. If a row or other set of FeRAM cells includes a FeRAM cell that provides a bit line voltage V0 or V1 that is outside the acceptable range, calibration circuit 1260 signals redundancy circuit 1215. Redundancy circuit 1245 can then designate the defective set (e.g., row) of FeRAM cells for replacement by a set of redundant FeRAM cells 1220. The dynamic replacement of FeRAM cells that fail during operation of the FeRAM will improve the reliability and lifetime of memory 1200.

The calibration processes disclosed herein have many advantages over the previous schemes for selecting reference voltages. In particular, calibration by periodically evaluating actual FeRAM cells tracks all changes in the ferroelectric capacitors due to temperature, fatigue, and other effects. The calibration process does not require reference cells to generate the reference voltage. The calibration circuit also has the flexibility to perform self test of FeRAM cells, which can be used with redundancy circuitry as described above, and the calibration circuitry can provide different reference voltages for different banks or sets of FeRAM cells.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A memory comprising:
    an array of ferroelectric memory cells arranged in rows and columns, each column of ferroelectric memory cells being connected to a corresponding bit line;
    a set of sense amplifiers connected to sense a set of the bit lines;
    a reference voltage generator connected to provide a reference signal to the set of sense amplifiers for use when sensing the bit lines, wherein a voltage level of the reference signal depends on an input value; and
    a calibration circuit that controls a calibration operation that evaluates bit line voltages read out of the set of the ferroelectric memory cells and based on an evaluation result, sets the input value to be used when reading the set of ferroelectric memory cells.

2. The memory of claim 1, wherein the calibration circuit comprises:
    a first counter holding a first count that is applied as the input value of the reference voltage generator during evaluation of bit line voltages read out when the set of ferroelectric memory cells store a first value; and
    control logic that causes the first counter to increment the first count until a data signal from the sense amplifiers read represents the first value.

3. The memory of claim 2, wherein the calibration circuit further comprises a second counter containing a second count that is applied as the input value of the reference voltage generator during evaluation of bit line voltages read out when the set of ferroelectric memory cells store a second value, wherein the control logic causes the second counter to decrement the second count until the data signal from the sense amplifiers represents the second value.

4. The memory of claim 3, wherein calibration circuit further comprises a comparator coupled to the first and second counters, wherein the control logic alternately causes the first counter to increment the first count and the second counter to decrement the second count until the comparator indicates the first and second counts are equal, the first and second counters then hold the input value to be used when reading the set of ferroelectric memory cells.

5. The memory of claim 1, further comprising redundancy circuitry coupled to the calibration circuit, wherein the calibration circuit signals the redundancy circuit when evaluating the bit line voltages identifies one or more of the ferroelectric memory cells is weak or defective, the redundancy circuitry replacing the ferroelectric memory cells that the calibration circuit identified as being weak or defective.

6. A method for operating a memory, comprising:
    evaluating bit line voltages read out of a set of ferroelectric memory cells; and
    storing a reference value that the evaluation of the bit line voltages indicates corresponds to a voltage level for a reference signal that permits accurate reading of the set of ferroelectric memory cell.

7. The method of claim 6, wherein a control circuit in the memory controls evaluating the bit line voltages and storing of the reference value.

8. The method of claim 6, wherein the method is preformed during normal use of the memory.

9. The method of claim 6, evaluating the bit line voltages comprises:
    (a.) writing a data value in the set of ferroelectric memory cells;
    (b.) reading out bit line voltages from the ferroelectric memory cells;
    (c.) changing a voltage level of a reference signal applied to a set of sense amplifiers to a next level;
    (d.) using the sense amplifiers to sense the bit line voltages;
    (e.) determining whether a data signal output from the sense amplifier represent the data value; and
    (f.) repeating steps (c.), (d.), and (e.) until step (e.) determines that the data signal represents the data value.

10. The method of claim 9, wherein step (c.) comprises incrementing the voltage level.

11. The method of claim 9, wherein step (c.) comprises decrementing the voltage level.

12. The method of claim 6, wherein evaluating the bit line voltage comprises:
    determining a first value that corresponds to a highest of the bit line voltages that results from reading from the ferroelectric memory cells that store a first value; and
    determining a second value that corresponds to a lowest of the bit line voltages that results from reading from the ferroelectric memory cell that stores a second value, wherein
    the reference value is between the first and second values.

13. The method of claim 12, wherein the reference value is an average of the first and second values.

14. The method of claim 12, further comprising:
    identifying a second set of the ferroelectric memory cells that the evaluation of the bit line voltages indicates include one or more weak ferroelectric memory cells;
    replacing the second set of the ferroelectric memory cells with a set of redundant memory cells.

* * * * *